(12) United States Patent
Ghyselen et al.

(10) Patent No.: US 7,422,957 B2
(45) Date of Patent: Sep. 9, 2008

(54) SEMICONDUCTOR SUBSTRATES HAVING USEFUL AND TRANSFER LAYERS

(75) Inventors: Bruno Ghyselen, Seyssinet (FR); Fabrice Letertre, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 34 days.

(21) Appl. No.: 11/402,052

(22) Filed: Apr. 12, 2006

(65) Prior Publication Data
US 2006/0189095 A1 Aug. 24, 2006

Related U.S. Application Data

(60) Continuation of application No. 11/009,138, filed on Dec. 13, 2004, now Pat. No. 7,071,029, which is a division of application No. 10/446,604, filed on May 27, 2003, now Pat. No. 6,867,067, which is a continuation of application No. PCT/FR01/03715, filed on Nov. 26, 2001.

(30) Foreign Application Priority Data
Nov. 27, 2000 (FR) .................................. 00 15280

(51) Int. Cl.
*H01L 21/76* (2006.01)
*H01L 21/301* (2006.01)

(52) U.S. Cl. ........................ 438/406; 438/409; 438/455; 438/458; 438/464

(58) Field of Classification Search .................. 438/107, 438/406, 409, 455, 458, 464
See application file for complete search history.

(56) References Cited

U.S. PATENT DOCUMENTS

| | | | |
|---|---|---|---|
| 4,983,251 A | 1/1991 | Haisma et al. .............. 156/630 |
| 5,374,564 A | 12/1994 | Bruel ........................... 437/24 |
| 6,010,579 A | 1/2000 | Henley et al. ............... 148/33.2 |
| 6,100,166 A | 8/2000 | Sakaguchi et al. .......... 438/455 |
| 6,107,213 A | 8/2000 | Tayanaka ..................... 438/762 |
| 6,114,188 A | 9/2000 | Oliver et al. ................. 438/107 |
| 6,214,701 B1 | 4/2001 | Matsushita et al. .......... 438/458 |
| 6,326,279 B1 | 12/2001 | Kakizaki et al. ............. 438/406 |
| 6,423,614 B1 * | 7/2002 | Doyle .......................... 438/458 |

FOREIGN PATENT DOCUMENTS

| | | |
|---|---|---|
| EP | 0 528 229 A2 | 2/1993 |
| FR | 2 787 919 A1 | 6/2000 |
| WO | WO 99/01899 A1 | 1/1999 |
| WO | WO 99/41776 A1 | 8/1999 |

* cited by examiner

*Primary Examiner*—Hsien-ming Lee
(74) *Attorney, Agent, or Firm*—Winston & Strawn LLP

(57) ABSTRACT

Methods for fabricating final substrates for use in optics, electronics, or optoelectronics are described. The method includes forming a zone of weakness beneath a surface of a source substrate to define a transfer layer; detaching the transfer layer from the source substrate along the zone of weakness; depositing a useful layer upon the transfer layer; and depositing a support material on the useful layer to form the final substrate. The useful layer may be deposited on the transfer layer before or after detaching the transfer layer from the source substrate. The useful layer is typically made of a material having a large band gap, and comprises at least one of gallium nitride, or aluminum nitride, or of compounds of at least two elements including at least one element of aluminum, indium, and gallium. The zone of weakness may advantageously be formed by implanting atomic species into the source substrate.

21 Claims, 8 Drawing Sheets

FIG_1

FIG_2

FIG_3

FIG_4

FIG_5

FIG_6

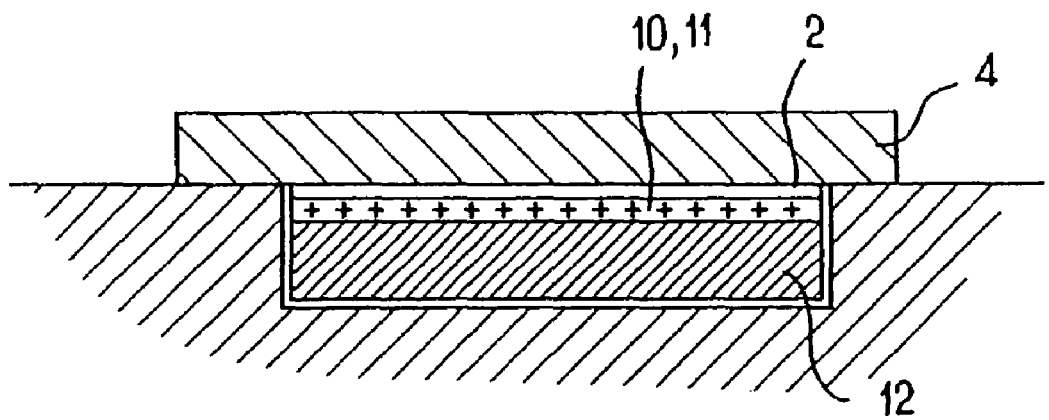
FIG_8a
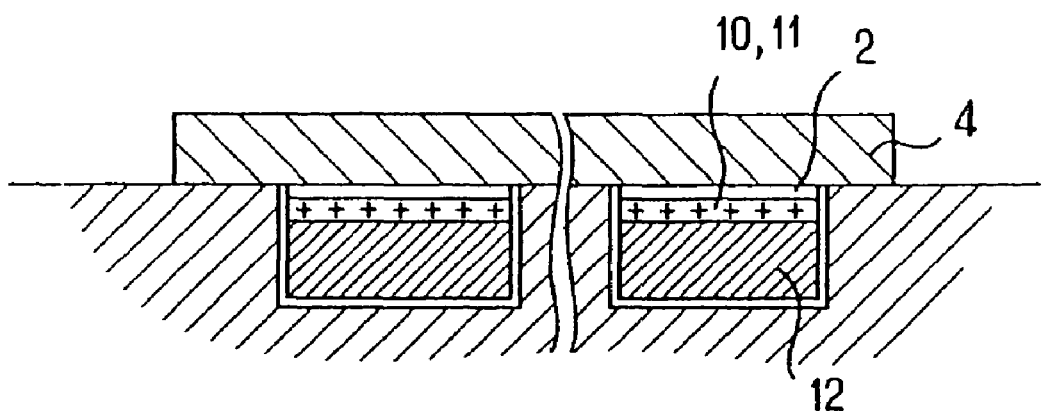
FIG_8b

SEMICONDUCTOR SUBSTRATES HAVING USEFUL AND TRANSFER LAYERS

CROSS-REFERENCE TO RELATED APPLICATIONS

This application is a continuation of application Ser. No. 11/009,138 filed Dec. 13, 2004, now U.S. Pat. No. 7,071,029, which is a divisional of application Ser. No. 10/446,604 filed May 27, 2003, now U.S. Pat. No. 6,867,067, which is a continuation of International Application PCT/FR01/03715 filed Nov. 26, 2001, the entire content of each of which is expressly incorporated herein by reference thereto.

BACKGROUND ART

The invention relates to methods of fabricating substrates, in particular for optics, electronics, or optoelectronics, and also to substrates obtained by such methods. More particularly, the substrates can be used to make microsystems, sensors, light-emitting or laser diodes, and the like.

U.S. Pat. No. 5,374,564 discloses a method of fabricating substrates in which a thin layer of a material is transferred from a source substrate onto a support. The operation of bonding the thin layer to the support is often achieved by molecular adhesion, and in order to obtain a good adhesive interface the surfaces that are to be bonded together must be specially prepared prior to being brought into contact. Such preparation generally includes polishing, planarizing, physical-chemical treatment, fabrication of intermediate layers, and the like, which can be relatively lengthy and complex. This is particularly true when the supporting substrate is polycrystalline.

Thus, improvements in such substrate preparation methods are desired, and certain new and useful methods are provided by the present invention.

SUMMARY OF THE INVENTION

New and useful methods for fabricating final substrates for use in optics, electronics, or optoelectronics are described. In one embodiment, the invention relates to a method which comprises forming a zone of weakness beneath a surface of a source substrate to define a transfer layer; detaching the transfer layer from the source substrate along the zone of weakness; depositing a useful layer upon the transfer layer; obtaining a bilayer made of the useful layer and the transfer layer; and depositing a support material on one of the useful layer or the transfer layer to form the final substrate. The useful layer is typically made of a material having a large band gap, and comprises at least one of gallium nitride, or aluminum nitride, or of compounds of at least two elements including at least one element of aluminum, indium, and gallium. The support material is made of at least one of silicon, silicon carbide, sapphire, diamond, graphite, gallium nitride, aluminum nitride, and a combination of at least two of these materials.

The method can also include forming a bonding layer on one of the transfer layer or the useful layer, or both, to facilitate bonding of the useful and transfer layers. The bonding layer(s) may be made of at least one of amorphous materials, polycrystalline materials, and metallic materials. Preferably, the transfer layer is made of at least one of silicon (1,1,1,), silicon carbide, a monocrystalline material, sapphire, diamond, gallium nitride, aluminum nitride, or a combination of at least two of these materials.

The method may also include optimizing the conditions under which the support material is deposited so that the support material exhibits at least one of monocrystalline quality, polycrystalline quality, an insulating quality, and a conductive quality. Also, the transfer layer may be transferred to an intermediate support prior to obtaining the bilayer by depositing the useful layer thereon. Instead, the transfer layer may be transferred to an intermediate support before depositing the useful layer on the transfer layer and thereafter, the intermediate support can be removed to form the final substrate. In certain embodiments, the source substrate can be moved removed after depositing the useful layer. To facilitate this, the source substrate or the support may be of a lower quality material than that of one or both of the useful and transfer layers.

The zone of weakness may advantageously be formed by implanting atomic species into the source substrate, and the method may also advantageously include depositing a useful layer on a face of the transfer layer. The transfer layer may also be used as a seed layer to form the support material. In addition, the method could include recycling at least one of the source substrate and the intermediate support.

Another variation of fabricating a final substrate for use in optics, electronics, or optoelectronics according to the invention includes forming a zone of weakness beneath a surface of a source substrate to define a transfer layer. The transfer layer is advantageously separated from the source substrate along the zone of weakness. A support material can be deposited onto the transfer layer to form the final substrate.

This method also advantageously includes depositing at least one useful layer on a face of the transfer layer. In addition, when the transfer layer is transferred onto an intermediate support prior to depositing the support material on the transfer layer, the transfer layer could also advantageously be used as a seed layer to form the support material. The zone of weakness may preferably be made by implanting atomic species in the source substrate close to a predetermined depth according to known techniques.

BRIEF DESCRIPTION OF THE DRAWING FIGURES

Other aspects, modifications, and advantages of the invention will appear on reading the following detailed description, and the invention will also be better understood with the help of the accompanying drawings, wherein:

FIGS. 8a and 8b are sectional views showing examples of substrates obtained in a variant of the method according to the invention.

DETAILED DESCRIPTION OF THE PREFERRED EMBODIMENTS

Figure 1:
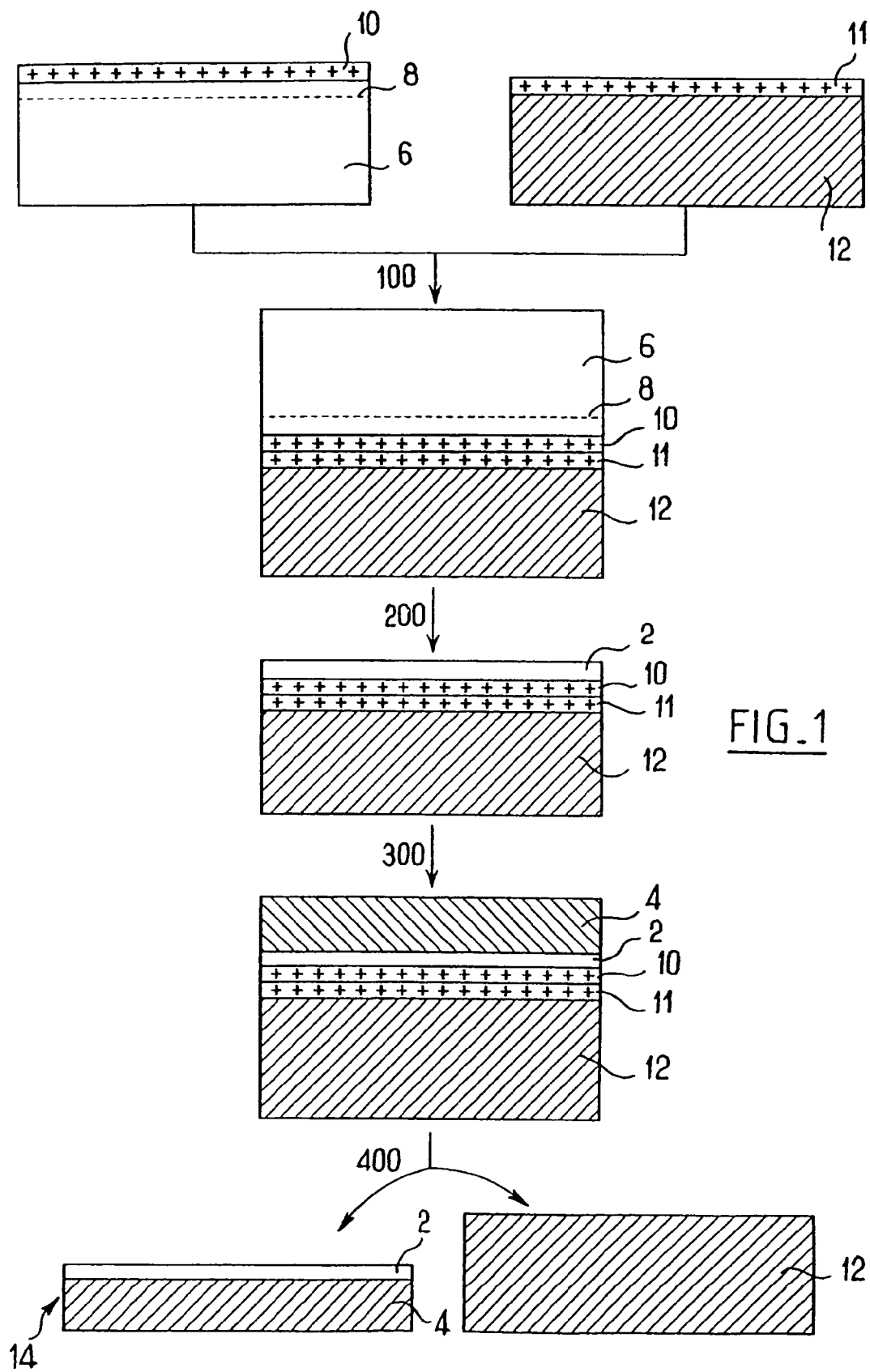
FIG. 1 is a diagram showing the steps in an implementation of the method in accordance with the invention.

The invention provides new ways for fabricating final substrates for use in the fields of optics, electronics, or optoelectronics. In particular, substrates having a thin useful layer carried by a mechanical support material or support layer are made. The method is significantly simpler in comparison to conventional methods and thus is much less expensive to use.

One embodiment of this method includes detaching a thin layer or transfer layer of material from a source substrate, and then depositing a thick layer of support material onto the thin layer to form a mechanical support layer. This method is simple to implement and it enables the omission of lengthy and expensive preparation procedures for the surfaces that are to be brought into contact, such as polishing, planarizing, and making intermediate layers. All of these steps can optionally be replaced merely by etching prior to forming the thick layer, which formation can advantageously be followed or accompanied by a high temperature treatment.

In particular, existing techniques for transferring a thin layer onto a thick support (and regardless of whether the thin layer is monocrystalline, polycrystalline, amorphous, etc.) transfer a thin layer as a single piece onto a previously-prepared thick support. In contrast, the present method forms the thick support directly onto the thin layer. Thus, implementing the present method gives rise to substantial savings because lengthy and expensive surface preparation steps are omitted.

The support material is advantageously deposited directly onto the transfer layer, for example, by using chemical vapor deposition (CVD). Under such circumstances, the interface obtained between the transfer layer and the support material is of excellent quality, particularly in terms of electrical and/or thermal conductivity, which is not generally the case when conventional methods are used. The support material is a relatively thick layer, and can also be formed by depositing metal, such as by an electrolytic deposit of copper. In addition, the thick support material layer can equally be well formed from a material that is molten, viscous or sintered. The skilled artisan can select the best way for forming the support material depending upon the specific use of the final substrate.

The method is advantageously implemented for making substrates in which the thin transfer layer and the thick support material layer are made of materials possessing close or identical coefficients of thermal expansion and/or crystal lattice parameters. The method is also particularly advantageous in the context of making composite substrates comprising a monocrystalline thin layer, such as a semiconductor material, on a support substrate that is polycrystalline, amorphous, ceramic, or multiphase. Certain techniques, in particular certain deposition and/or growth techniques, enable thick support material layers to be formed at low cost. For example, forming a thick layer of amorphous or polycrystalline silicon carbide on a thin layer of monocrystalline silicon carbide according to the present method makes it possible to form silicon carbide substrates at a lower cost than if the substrate were to be made completely out of a high quality monocrystalline silicon carbide.

Furthermore, the present method has the advantage of encouraging good quality growth of the support material. Thus, when it is desirable to make substrates at lower cost, conventional methods teach to transfer a thin monocrystalline layer onto an inexpensive support material such as polycrystalline or amorphous material. Regarding the present method, a thick layer of inexpensive material may be formed on the thin layer of a material having high added value. However, if the thin layer is itself monocrystalline, then the thick layer will be of better quality than it would have been if a one-piece layer of the same material as the thick layer had been transferred directly onto the thin layer. If the thick support material layer formed by the present method is polycrystalline, then better cohesion and better orientation of the various grains are obtained within that material, as is growth of privileged phases. However, this advantage can be diminished if the present method includes forming an intermediate layer, such as an amorphous insulator, between the thin layer and the support.

Under certain conditions, when the thick support material layer is grown on the thin transfer layer according to the present method, the thin layer serves as a seed layer for monocrystalline or quasi-monocrystalline growth of the thick support layer. These conditions correspond to the thick layer being grown epitaxially or quasi-epitaxially on the thin transfer layer. It should be understood that the method according to the invention can advantageously include combinations of the following aspects.

The method may include depositing a useful layer on one or both faces of the thin transfer layer. For example, the useful layer can be a material having a large band gap, such as gallium nitride, aluminum nitride, or another such material, e.g. a compound of at least two elements such as aluminum, indium, and gallium. At least one useful layer may be deposited before the thick support material layer is formed, or at least one useful layer may be deposited after the support material has been deposited. The useful layer and the thick support layer could each be deposited on a different face of the thin transfer layer. The thin transfer layer could be made of a monocrystalline material.

The support layer could be formed by depositing monocrystalline materials, polycrystalline materials, amorphous materials, materials comprising a plurality of phases, or materials that are less expensive than the material of the thin layer. A skilled artisan can select the optimum method to use based upon the intended use of the final substrate.

The present method could also include forming a bonding layer on the transfer layer, the bonding layer being made of amorphous materials, polycrystalline materials, metallic materials such as tungsten, or combinations of materials such as tungsten silicate. These properties can be combined (e.g. polycrystalline and metallic) if desired, and the bonding layer is preferably formed before the thin transfer layer is detached from the source substrate. The method may also includes a step of transferring the thin transfer layer onto an intermediate support prior to forming the thick support material layer on the transfer layer, and then eliminating the intermediate support if desired. The intermediate support may be eliminated by separating the transfer layer from the intermediate layer, and the intermediate layer can then be recycled.

The method can also include forming a bonding layer on the intermediate support before transferring the thin transfer layer thereon, the bonding layer being made of a material such as amorphous materials, polycrystalline materials, and metallic materials, for example, tungsten or tungsten silicate. It should be understood that these materials can be combined (for example, polycrystalline and metallic). The thin transfer layer may be preferably made of silicon, silicon carbide, sapphire, diamond, gallium nitride, aluminum nitride, or a combination of at least two of these materials. The thick support material layer may be preferably formed of silicon, silicon carbide, diamond, sapphire, graphite, gallium nitride, aluminum nitride, boron nitride, or a combination of at least two of these materials.

The thin layer may be detached from the source substrate via a zone of weakness. The zone of weakness is preferably made by implanting atomic species beneath the surface of the source substrate to a predetermined depth. The thin layer could also be detached from the source substrate by elimination, such as by chemically etching a zone between the transfer layer and the remainder of the source substrate.

Conditions for depositing the support material may be optimized so that the thick support material layer has a particular quality, such as good monocrystalline, polycrystalline, insulating, and conductive qualities. It should be understood that the support material may have two or more of these qualities, such as the good monocrystalline and conductive qualities.

In this document, the term "atomic implantation" covers all types of bombardment with atomic or ionic species suitable for causing the species to be introduced into a material so as to obtain a maximum concentration of the species in the material. The maximum concentration may be situated at a predetermined depth relative to the bombarded surface. The atomic or ionic species are introduced into the material with energy distributed around a maximum. Atomic species can be implanted into the material by using an ion beam implanter, an implanter that operates by immersion in a plasma, and the like. The term "atomic or ionic species" is used to cover an atom in ionized, neutral, or molecular form, or any molecule in ionic or neutral form, or any combination of different atoms or molecules in ionic or neutral form. While many different species can be used, hydrogen ions are preferred.

The method of the invention is described below with reference to five specific but non-limiting implementations.

In a first implementation shown in FIG. 1, a final substrate 14 includes a thin transfer layer 2 on a thick support material layer 4. The support material forms a mechanical support for the transfer layer. The final substrate is made by performing the following steps. A layer of amorphous material and a bonding layer 10 are formed on a surface of a source substrate 6 that is preferably subjected to the implantation of atomic species. Another bonding layer 11 is formed on a surface of an intermediate support 12 of amorphous material. The method preferably includes implanting atomic species at a determined depth in the source substrate 6 to form a zone of weakness 8, and in step 100, the bonding layers 10 and 11 are joined. In step 200, the transfer layer 2 is detached from the source substrate 6 via the zone of weakness 8. In step 300, a thick support material layer 4 is deposited on the surface of the transfer layer 2, and in step 400, the bonding layers 10 and 11 are eliminated to separate the transfer layer 2 from the intermediate layer 12.

It should be understood that the steps for forming the bonding layer 10 and of implanting atomic species can be performed in the order specified above, or in another order.

The step of implanting atomic species and the step 200 of detaching the thin layer 2 are described in U.S. Pat. No. 5,374,564, for example.

The steps of forming the bonding layers 10 and 11 may correspond to forming a layer of amorphous material using one of the known conventional methods.

It should be understood that the thin transfer layer 2 can be subjected to additional processing, prior to depositing the thick support layer 4 as shown in step 300, in order to form all or some electronic components. In addition, additional films could be deposited uniformly thereon, by epitaxial growth, or otherwise.

EXAMPLES

A number of non-limiting examples are now presented. The following table summarizes examples of materials that can be used for implementing the first embodiment described above. In this and the following tables, the term "mono" means "monocrystalline" and the term "poly" means "polycrystalline".

TABLE 1

| Thin layer 2 | Intermediate support 12 | Supporting thick layer 4 | Bonding layers 10, 11 |
|---|---|---|---|
| Mono SiC | Poly SiC or mono SiC | Poly SiC or poly AlN or diamond or mono SiC of quality inferior to that of the thin layer | $SiO_2$ or $Si_3N_4$ |
| Mono GaN | Poly SiC or mono SiC or sapphire | Poly SiC or poly AlN or poly GaN or diamond or mono SiC of quality inferior to that of the thin layer | $SiO_2$ or $Si_3N_4$ |
| {111}, {100} etc. mono Si | Poly Si or mono Si or poly SiC or mono SiC | Poly Si or mono Si of quality inferior to that of the thin layer | $SiO_2$ or $Si_3N_4$ |

Example 1

The first example corresponds to the first row of Table 1.

The first implementation is particularly advantageous for forming a substrate comprising a thin transfer layer 2 of monocrystalline silicon carbide on a thick support material layer 4 of polycrystalline silicon carbide. Silicon carbide is difficult to obtain in single crystal form, even with diameters that are much smaller than those which are commonly obtained for single silicon crystals. This is due in particular to the fact that crystal-drawing techniques are more complex and expensive for monocrystalline silicon carbide than for monocrystalline silicon. In addition, the substrate forming steps are more difficult, more time consuming, and more expensive, for monocrystalline silicon carbide because of the unfavorable ratio between the hardness and the brittleness of silicon carbide. The present method is thus particularly advantageous for fabricating substrates with thin transfer layers 2 of silicon carbide since it enables multiple thin layers 2 to be separated from a source substrate 6, and each of those thin transfer layers 2 can be transferred to a low cost thick support material layer 4.

Furthermore, silicon carbide is used mainly in high power semiconductor devices. Unfortunately, in such applications, certain very restrictive specifications limit the selection of suitable support substrates for receiving the thin layer 2 of silicon carbide. In some circumstances, such applications require the support to have good electrical and thermal conductivity properties. Polycrystalline silicon carbide satisfies these requirements. In some of its properties, it is very close to monocrystalline silicon carbide. For example, it provides a good match in terms of the thermal expansion coefficient and it is compatible with treatment at temperatures that can be as high as 1600° C. or 1700° C. (temperatures that are required for restarting silicon carbide epitaxy and for annealing after atomic species have been implanted).

Furthermore, the use of polycrystalline silicon carbide requires little modification to the techniques used by those who commonly use monocrystalline silicon carbide. Finally, polycrystalline silicon carbide has good properties with respect to withstanding chemical attack.

When making a thin transfer layer 2 of monocrystalline silicon carbide on a thick support material layer 4 of polycrystalline silicon carbide, the bonding layers 10 and 11 are advantageously made of silicon oxide. The thick support layer 4 can be made by chemical vapor deposition (which has the major advantage of being capable of being performed at relatively low deposition temperatures, i.e. at about 1350° C. for silicon carbide), by vapor phase epitaxy (VPE) or hydride vapor phase epitaxy (HVPE), by high temperature chemical vapor deposition (HTCVD), or by other equivalent techniques. The thick support layer 4 can also be made using techniques derived from those generally implemented for making single crystals, such as subliming techniques or other techniques generally used in methods for drawing balls. The use of such techniques is not always good from the point of view of deposition quality (due to low temperatures, non-uniform conditions, high rates of growth, etc.), but can be advantageous from the point of view of cost.

For silicon carbide substrates having a diameter of about 50 millimeters (mm), the thick support layer 4 is advantageously about 300 microns (μm) thick. The thick support layer 4 of silicon carbide may be advantageously made by chemical vapor deposition with growth taking place at a rate of about 100 μm per hour.

Furthermore, by using a monocrystalline material surface of the thin transfer layer 2 for depositing 300 the thick support layer 4, deposition parameters can be optimized so as to produce a monocrystalline support substrate. The thin transfer layer 2 can thus serve as a seed layer for growing a monocrystalline thick support material layer 4. Depending on the degree of optimization of the deposition parameters and depending on the intended application, this monocrystalline thick support layer 4 can be of poor or of medium quality, but the resulting substrate will nevertheless present the advantage of being of relatively low cost. However, it is also possible for the monocrystalline thick support layer 4 to be of good or of very good quality if required. The thick support layer 4 can be grown to form a substrate with a layer 4 that is very thick, for example, that is a great deal thicker than a few hundreds of micrometers, depending on the application. In variants of the implementation described above, the thick support layer 4 can be made not only of silicon carbide, but of polycrystalline aluminum nitride, of diamond, or of other materials.

The intermediate support 12 must be capable of withstanding conditions in which the thick support layer 4 of silicon carbide is grown, and must also be capable of being eliminated. The technique selected for removing the intermediate support 12 can also help to select the material used to make it. If it is to be removed by etching or by mechanical or chemical removal, then the etching and removal steps, and also the intermediate support 12 must be of low cost. In such a situation, it is advantageous to use aluminum nitride. Low cost silicon can also be used, but it is more difficult to make silicon compatible with the silicon carbide of the thick support layer 4. In contrast, if the intermediate support 12 is removed and recovered, then it is possible to use materials that are more expensive. Under such circumstances, it is possible to select polycrystalline silicon carbide, or possibly monocrystalline silicon carbide since it can be reused.

Advantageously, an intermediate support 12 is used made of polycrystalline silicon carbide covered in a bonding layer 11 of silicon oxide. The use of silicon oxide makes it easier to remove the thin transfer layer 2 from the source substrate 6. Planarized deposition of silicon oxide makes it possible to eliminate any surface irregularities and to perform polishing, planarizing, cleaning, chemical preparation, and bonding silicon oxide on silicon oxide operations by using techniques that are known and easy to implement.

The silicon oxide material of the bonding layers 10 and 11 can also be replaced by some other material, for example silicon nitride ($Si_3N_4$). This material can withstand higher temperatures than silicon oxide, which makes it particularly suitable for optimizing the deposition of a thick support layer 4 for the purpose of forming a high quality monocrystalline or polycrystalline layer, or when an increased rate of deposition is desired.

This first example of an implementation of the present method includes making a multi-layer structure, or stack, having a thin transfer layer 2 of monocrystalline silicon carbide, two bonding layers 10 and 11 of silicon oxide, and an intermediate support 12 of polycrystalline or monocrystalline silicon carbide. This structure can be made by a layer transfer method known to the person skilled in the art (e.g. an application of a SMART-CUT® method of the kind described in U.S. Pat. No. 5,374,564). Referring to FIG. 1, the method also includes, in step 300, depositing a thick support layer 4 of silicon carbide, for example, by CVD at 1350° C. onto the free surface of the thin transfer layer 2. Then, in step 400, the bonding layers 10 and 11 are eliminated by chemical etching in a bath of hydrofluoric acid, and the intermediate support layer 12 is recovered. The silicon carbide can be in polycrystalline or monocrystalline form and is inert in hydrofluoric acid, whereas silicon oxide etches very easily in this substance. Lastly; the surface of the polycrystalline silicon carbide thick layer 4 can undergo a final rough polishing, because rough polishing is sufficient since the thick support layer 4 becomes the rear support face of the final substrate 14. Under certain conditions the thick support layer 4 is deposited in a controlled manner so that this final polishing step can be omitted.

If necessary, the geometrical shape of the final substrate 14 may be modified to ensure that the final substrate 14 has the desired diameter, or to shape the way its sides drop, or to eliminate nodules from the edges of the substrate, and the like. In addition, the front face of the silicon carbide single crystal of the final substrate 14, which is the free surface of the thin layer 2, can advantageously be protected during finishing operations. In particular, the front face may be protected during any optional polishing operation of the rear face of the final substrate 14. It should be noted that during the initial steps of the method, the thin transfer layer 2 is naturally protected by the intermediate support 12.

The final substrate 14 obtained by the above-described implementation presents an interface between the thin transfer layer 2 and the thick support layer 4 which is highly conductive, both electrically and thermally. This occurs because the material of the thick support layer 4 is deposited directly onto the thin layer 2, making it possible to avoid the voids that would otherwise be formed during bonding which occurs when using conventional methods. In addition; unlike prior art techniques, there are no intermediate layers of silicon oxide or other like materials that are generally used in adhesive techniques. The present method also makes it possible to omit the steps of planarizing and polishing the silicon carbide, which is a very hard and chemically inert material. This is particularly advantageous since detrimental polishing problems may occur when using polycrystalline silicon carbide since the rates of attack during polishing vary between grains, or between grains and grain boundaries, and also may vary as a function of the intrinsic and bulk crystal quality of the grains.

Nevertheless, it should be observed that in certain applications, the method can be implemented to form a thick support layer 4 in which the selected materials or conditions of implementation result in an interface which is a poor conductor of electricity or heat. This can occur by using an intermediate layer of insulating material between the thin transfer layer 2 and the thick support layer 4.

The first implementation of the present method can be the subject of numerous variants. In particular, other materials can be substituted, such as those listed by way of example in the first row of Table 1. In this first implementation, it is also possible to. substitute the step 400 of chemically etching the bonding layers 10 and 11 for an operation involving separating the intermediate support 12 and the thin transfer layer 2. For example, if the intermediate support 12 has undergone a prior operation of implanting atomic species therein, then a mechanical stress can be applied to cause the separation. Other techniques for facilitating the step 400 to eliminate the bonding layers 10 and 11 and/or to separate the intermediate support 12 from the thin layer 2 could be used, such as by forming channels in the bonding layers 10 and 11.

It is also possible to implement the present method without using an intermediate support 12. This applies transferred thin layer 2 is sufficiently thick and is made of a material that is sufficiently strong. For example, a thin layer 2 of silicon carbide having a thickness of about a few tens of microns can have sufficient mechanical strength.

It should also be observed that the polarity of the thin transfer layer 2 of silicon carbide taken from the source substrate 6 can be selected as a function of the polarity of the initial source substrate 6. The polarity of a silicon carbide substrate corresponds to the Si face or to the C face and is a concept which is well known to the person skilled in the art. It is possible to take the thin layer 2 from the source substrate 6 by applying two transfer operations thus making it possible to change polarity twice.

It is also possible to form an intermediate layer, like an insulating layer, on the thin transfer layer 2 before depositing the thick support layer 4. For example, the intermediate layer can be a fine oxide (500 angstroms (Å) thick). This provides, for example, an SiC substrate on insulation, made up of a thin layer 2 of SiC on a fine intermediate layer of silicon oxide, with both layers then being located on a thick layer 4 of polycrystalline silicon.

A second example of the first implementation is described below. In this example, the operation corresponds to making a substrate of gallium nitride, for optoelectronic applications in particular.

Example 2

Figure 2:
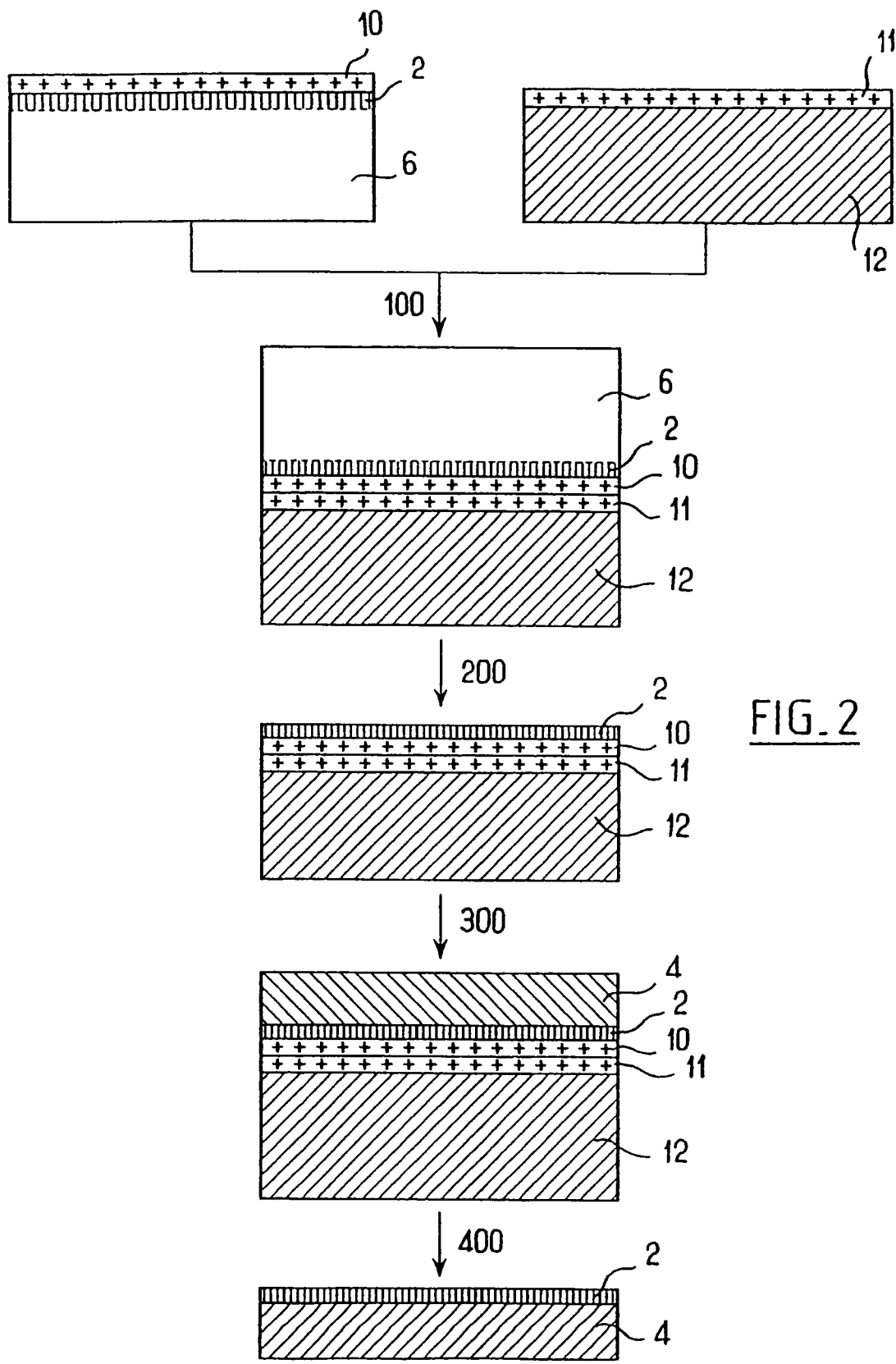
FIG. 2 is a diagram of the steps in another implementation of the method in accordance with the invention.

This second example corresponds to the second line of Table 1, and comprises the steps shown in FIG. 2. The operation includes depositing a thin layer 2 of monocrystalline gallium nitride on a source substrate 6 of monocrystalline silicon carbide by metal organic chemical vapor deposition (MOCVD) or by molecular beam epitaxy (MBE). A bonding layer 10 of silicon oxide is deposited on the thin layer 2, and a bonding layer 11 of silicon oxide is deposited on an intermediate support 12 of polycrystalline silicon carbide. Next, in step 100, the two bonding layers 10 and 11 are placed in contact with each other, and bonded together. The method includes, in step 200, detaching the thin layer 2 of gallium nitride from the source substrate 6 via the interface between the thin transfer layer 2 and the source substrate 6 (e.g. by applying mechanical stresses) or via a zone of weakness made, for example, by implanting atomic species in the monocrystalline silicon carbide of the source substrate 6 or in the gallium nitride of the thin layer 2. Next, in step 300, a thick support layer 4 of polycrystalline silicon carbide is deposited by CVD onto the free surface of the thin layer 2, and in step 400, the intermediate support is separated by eliminating the bonding layers 10 and 11, e.g. in a bath of hydrofluoric acid or merely by removing material (by eliminating the intermediate support 12 and the bonding layers 10 and 11 using the so-called "Etch-back" technique) or by fracturing the bonding layers 10 and 11 via a pre-weakened zone or otherwise, or by using any other technique known to the person skilled to enable a substrate to be separated into two portions in a predetermined zoned by applying a mechanical, thermal, chemical, electrostatic, or other type of stress.

Other variants of Example 2 are contemplated. Thus, the operation 300 of depositing polycrystalline silicon carbide can be replaced by chemical vapor deposition of polycrystalline aluminum nitride or polycrystalline gallium nitride, or by forming a diamond layer in order to form the thick support layer 4. In another variant, the polycrystalline gallium nitride of the thick support layer 4 is formed by high pressure VPE. In yet another variant, the polycrystalline silicon carbide of the intermediate support 12 is replaced by aluminum nitride or sapphire; a thick support layer 4 of polycrystalline aluminum nitride can then be deposited 300 by CVD prior to eliminating 400 the bonding layers 10 and 11. In yet another variant, the method is the same as in one of the variants describe with reference to Example 2, except that a final thin transfer layer 2 is made of not only gallium nitride, but also a layer of the underlying silicon carbide of the source substrate 6. This can be done by forming a weak layer at a certain depth in the source substrate 6, for example, by implanting atomic species. In such a case, in yet another variant, not only are the bonding layers 10 and 11 eliminated, but the portion of the thin transfer layer 2 that is made of silicon carbide is also eliminated if two transfers are performed on the thin transfer layer 2, such that an extra transfer occurs before placing it on the intermediate support 12.

In yet other variants, the layer of gallium nitride making up the thin transfer layer 2 is replaced by aluminum nitride or some other material, or by a stack of different materials, possibly together with other intermediate compounds.

Example 3

A third example of the first implementation is described below.

This example corresponds to making monocrystalline silicon substrates of large diameter. These substrates are expensive since they are difficult to make. As for monocrystalline silicon carbide substrates, it is advantageous to make a thin layer of monocrystalline material on a support material of poorer quality, for example of a material that is polycrystalline, amorphous, or otherwise. If the thin transfer layer is bonded directly onto a support, then difficulties will arise concerning polishing, planarizing, physical-chemical operations at the adhesive interface, degassing, and the like. The present method advantageously makes it possible to avoid such difficulties, since the support is made by directly depositing a thick support layer 4 on one of the faces of the thin transfer layer 2.

As mentioned above, the method of the invention makes it possible to provide an interface of very good quality.

Advantageously, doping is performed, possibly varying as a function of depth while the thick layer 4 is being deposited to enhance the electrical and thermal transparency of the interface.

The third example corresponds to the third row of Table 1. A thin transfer layer 2 of monocrystalline silicon is made on insulation (bonding layer 10 and/or 11), on an intermediate support 12. Next, a thick support layer 4 of polycrystalline silicon is formed 300 on the thin transfer layer 2 so as to have a thickness of at least 725 μm. In step 400, the intermediate support 12 is separated and recovered. A physical-chemical treatment is performed by selective etching of silicon/silicon oxide (e.g. using hydrofluoric acid) and/or mechanical removal operations are performed so as to ensure that the surface zone of the silicon in the thin layer 2 is of good quality. Lastly, forming operations are performed with attention to the planar quality, the thickness, the edges, and the like (which may include polishing, lapping, shaping the edges, chemical treatment of the final substrate 14 in order to make it comply with standards such as SEMI or JEIDA, for example).

As already described above, the step of making a substrate of silicon on insulation can be performed by implanting atomic species to create a zone of weakness 8 in a silicon source substrate 6. Then a silicon oxide bonding layer 10 is formed on the source substrate 6, and another silicon oxide bonding layer 11 is formed on the intermediate support 12 of silicon which can be polycrystalline or even monocrystalline. Then the bonding layers 10 and 11 are joined to bond them together prior to detaching the thin transfer layer 2 from the source substrate 6. This step of making a substrate of silicon on insulation can be performed by a SMART-CUT® technique, for example (see U.S. Pat. No. 5,374,564, for example).

After the thick support layer 4 has been formed, the silicon on insulation substrate must be removed. Removal can be done using any known technique suitable for detaching the thin transfer layer 2 of silicon from the source substrate 6. One such technique is known as the "lift-off" technique, whereby the buried silicon oxide is eliminated (e.g. the bonding layers 10 and 11). Another technique can make use of mechanical stress. Instead of using the above-mentioned lift-off technique, it is also possible to use mechanical, thermal, electrostatic, and/or other stresses to separate the two parts situated on either side of an adhesive interface, an epitaxial interface, a porous zone, or a pre-weakened zone, for example.

The intermediate support 12 can be separated via the first adhesive interface or via any one of the adhesive interfaces between the bonding layers 10 and 11 and the intermediate support 12. If an additional step of implanting atomic species (e.g. hydrogen) is performed, separation may occur in the bonding layers 10 and 11, in the thin transfer layer 2, or in the intermediate support 12 via the weakened zone.

It will be observed that the above-mentioned forming operations can also be implemented in part or in full prior to separating the thin transfer layer 2 from the intermediate support 12.

It should also be observed that prior to the step 300 of depositing the thick layer 4, insulation (such as an oxide, nitride, diamond and the like) can be formed on the thin layer 2 so that the final substrate 14 has a silicon on insulation structure. In a variant of the example described above, a thick layer 4 of diamond is formed on the thin layer 2. The resulting final substrate 14 is particularly advantageous when it is necessary to have good heat removal of any heat generated within the thin transfer layer 2.

Figure 3:
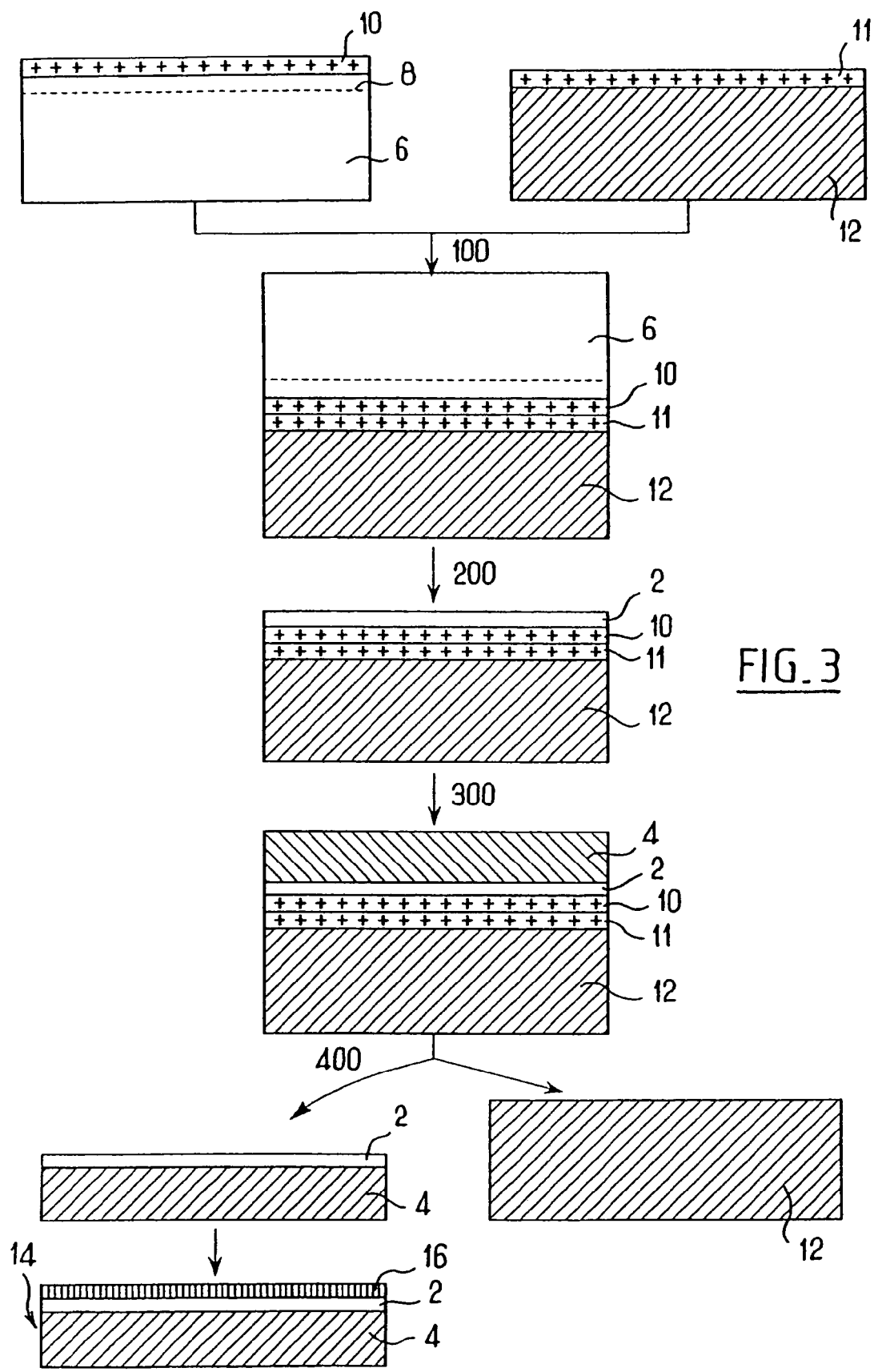
FIG. 3 is a diagram of the steps in yet another implementation of the method in accordance with the invention.

A second implementation of the present method is shown in FIG. 3. A thin layer 2 is formed on a thick layer 4 in the manner described above for the first implementation, and then a useful layer 16 is deposited on the free face of the thin transfer layer 2.

Table 2 below summarizes six examples of this second embodiment of the present method in the context of making substrates of interest in the fields of electronics, optics, or optoelectronics.

TABLE 2

| Useful layer 16 | Thin layer 2 | Intermediate support 12 | Thick layer 4 | Bonding layers 10, 11 |
| --- | --- | --- | --- | --- |
| GaN or AlN or AlGaN or GaInN or other | Mono SiC | Poly SiC or mono SiC (in particular if recycled) | Poly SiC or diamond or boron nitride | SiO$_2$ or Si$_3$N$_4$ |
| GaN or AlN or AlGaN or GaInN or other | {111} Si | Poly SiC or mono SiC (in particular if recycled) | Poly SiC or diamond or boron nitride | SiO$_2$ or Si$_3$N$_4$ |
| GaN or AlN or AlGaN or GaInN or other | Sapphire | Poly SiC or mono SiC (in particular if recycled) | Poly SiC or diamond or boron nitride | SiO$_2$ or Si$_3$N$_4$ |
| GaN or AlN or AlGaN or GaInN or other | Mono SiC or {111} Si or sapphire | Poly SiC or mono SiC (in particular if recycled) | Poly AlN or diamond or boron nitride | SiO$_2$ or Si$_3$N$_4$ |
| GaN or AlN or AlGaN or GaInN or other | Mono SiC or {111} Si or sapphire | Poly SiC or mono SiC (in particular if recycled) | Poly GaN or diamond or boron nitride | SiO$_2$ or Si$_3$N$_4$ |
| GaN or AlN or AlGaN or other | Mono SiC or {111} Si or sapphire | Poly AlN | AlN or GaN or poly SiC or diamond or boron nitride | SiO$_2$ or Si$_3$N$_4$ |

Example 4

In this example (see the 1st row of Table 2) a thin transfer layer 2 of monocrystalline silicon carbide is made on an intermediate support layer 12 of polycrystalline silicon carbide with bonding layers 10 and 11 of silicon oxide between them. A thick support layer 4 of polycrystalline silicon carbide is then deposited by CVD. The resulting structure is then subjected to treatment suitable for detaching the structure including the thin layer 2 on the thick layer 4 from the intermediate support. For example, such treatment may include etching the bonding layers 10 and 11 in hydrofluoric acid, with or without adding a mechanical stress. Treatment could also merely be removing the material of the intermediate support 12 and possibly also that of the bonding layers 10 and 11. Finally, a useful layer 16 of gallium nitride is deposited on the free face of the monocrystalline silicon carbide of the thin layer 2 by MOCVD. The useful layer 16 of gallium nitride is particularly suitable for optoelectronic applications.

Example 5

In this example (see second row of Table 2) a structure comprising a thin transfer layer 2 of {111} silicon is formed on an intermediate support 12 of polycrystalline silicon carbide in the manner described above. There is a layer of silicon oxide between them. A thick support layer 4 of polycrystalline silicon carbide is deposited on the thin transfer layer 2 of {111} silicon by CVD. The resulting structure is then subjected to treatment in a bath of hydrofluoric acid, with or without mechanical stress, or any other treatment suitable to separate the thin layer 2 and the thick support material layer 4 from the intermediate support 12. Thereafter MOCVD is used to deposit monocrystalline gallium nitride on the free surface of the {111} silicon, which is a material known for enabling good epitaxy of gallium nitride. The thickness of the {111} silicon is preferably advantageously limited to less than about 1000 Å to enable it to accommodate procedures without breaking due to thermal expansion that can occur during the various operations mentioned above.

Example 6

In this example (see third row of Table 2), a thin transfer layer 2 of sapphire is made on a polycrystalline silicon carbide intermediate support layer 12 having bonding layers 10 and 11 of silicon oxide between them. A support material layer 4 of silicon carbide is then deposited 300 (see FIG. 3) on the thin layer 2. The bonding layers 10 and 11 are eliminated to enable the intermediate support 12 to be recovered. Finally, a useful layer 16 of gallium nitride is deposited on the sapphire. Sapphire is another material that is known for enabling good epitaxy of gallium nitride.

Example 7

In this seventh example (see fourth row Table 2), one of the structures described in any one of the three preceding examples is made, but the thick support layer 4 of polycrystalline silicon carbide is replaced by a layer of polycrystalline aluminum nitride.

Example 8

In this example (see fifth row of Table 2), a structure is made of the type described in any one of Examples 4 to 6 above, but the thick support layer 4 of polycrystalline silicon carbide is replaced by a layer of polycrystalline gallium nitride deposited by HVPE.

Example 9

In this example (see sixth row of Table 2) a structure is made as described in any one of the five preceding examples, but in which the polycrystalline silicon carbide of the intermediate support 12 is replaced by polycrystalline aluminum nitride.

In examples 3 to 9 above, the monocrystalline silicon carbide, the {111} silicon, or the sapphire is used as a substrate for gallium nitride epitaxy. The advantage of silicon carbide is that its coefficient of thermal expansion is similar to that of gallium nitride.

It should be noted that the thickness properties of the thick support layer 4 can be important. For example, it may be desirable to make an electrical contact with the rear face of the final substrate 14, or to vent heat generated by components formed in the useful layer 16, or to extract and control light emitted by a diode or a laser made in the useful layer 16.

It should also be noted that if the thin transfer layer 2 has a suitable thickness and is sufficiently stiff, then structures equivalent to those described above can be made without using an intermediate support 12.

Numerous other variants of this second implementation of the method are also possible. Thus, the step of forming the thick layer 4 of polycrystalline SiC, of aluminum nitride, or of gallium nitride, can be replaced by a step of forming a thick layer 4 of diamond or of boron nitride.

In other variants, the nature of the intermediate support 12 can be different. Thus, monocrystalline silicon carbide can be used (in particular when it can be recycled), to replace the polycrystalline silicon carbide or the polycrystalline aluminum nitride.

Similarly, these examples can be changed to reflect a structure, for example, in which a useful layer 16 of aluminum nitride, of an alloy of aluminum and gallium, or of an alloy of gallium and indium, and the like is formed in accordance with the present method instead of the useful layer 16 of gallium nitride as described above. The useful layer 16 of gallium nitride can also be a multilayer structure made of a stack of layers of gallium nitride, aluminum nitride, and such like types, with optional different kinds of doping, and the like.

Figure 4:
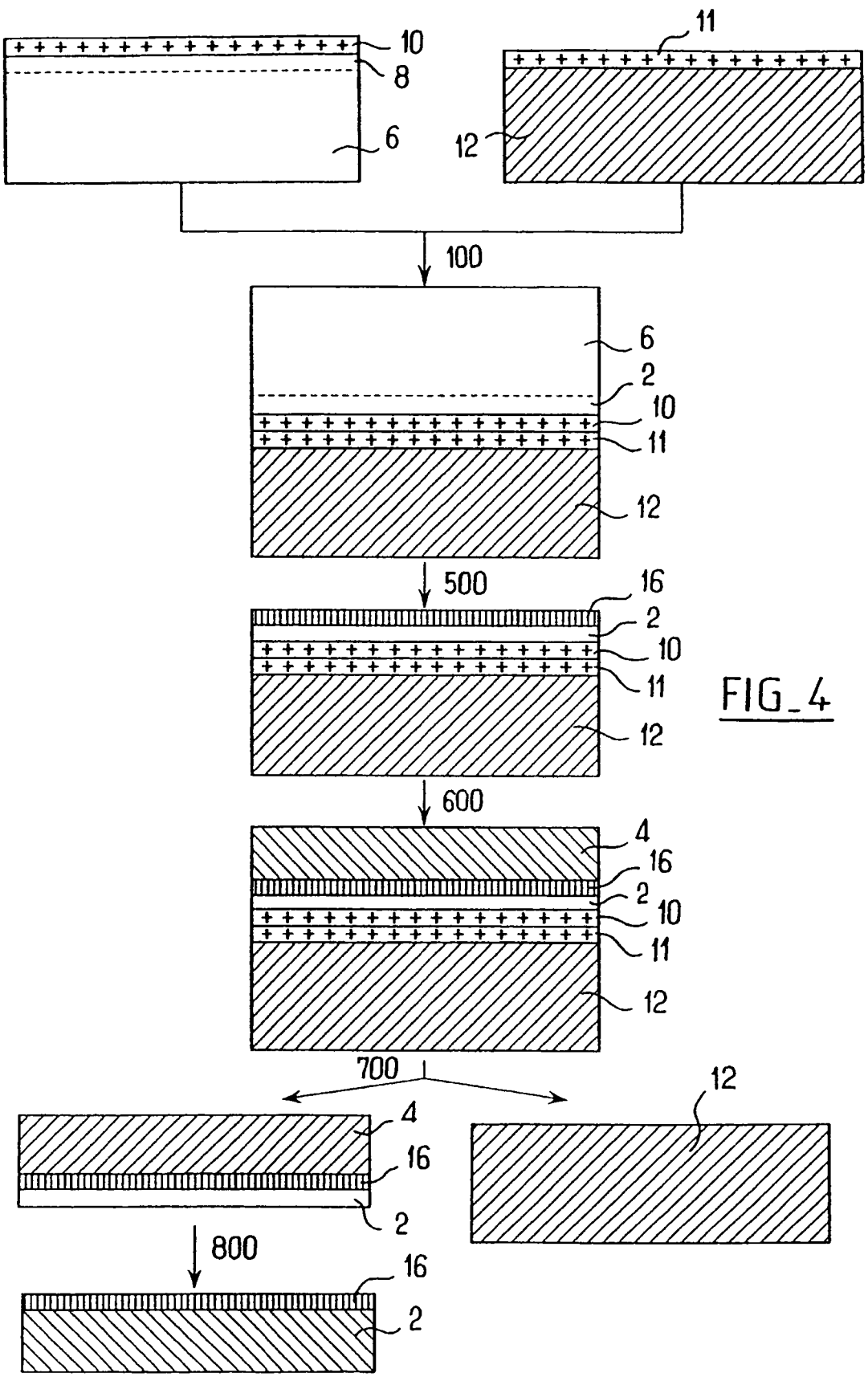
FIG. 4 is a diagram of the steps in yet another implementation of the method in accordance with the invention.

A third implementation of the present method is shown in FIG. 4. A structure is formed in which the thick layer 4 is deposited directly on the useful layer 16, contrary to the description given above for the second implementation of the method. The useful layer 16 is itself deposited directly on the thin transfer layer 2 after this layer has been separated from the source substrate 6.

The third implementation of the method of the invention is described below, and the materials used in the context of these three examples are summarized in Table 3.

TABLE 3

| Useful layer 16 | Thin layer 2 | Intermediate support 12 | Thick layer 4 | Bonding layers 10, 11 |
|---|---|---|---|---|
| GaN or AlN or AlGaN or | Mono SiC or {111} Si or | Poly (or mono) SiC or poly AlN | AlN or GaN or poly SiC or | SiO$_2$ or Si$_3$N$_4$ |

TABLE 3-continued

| Useful layer 16 | Thin layer 2 | Intermediate support 12 | Thick layer 4 | Bonding layers 10, 11 |
|---|---|---|---|---|
| GaInN or other | sapphire | or diamond or other | other | |
| GaN or AlN or AlGaN or GaInN or other | Mono SiC or {111} Si or sapphire + etching | Poly (or mono) SiC or poly AlN or diamond or other | AlN or GaN or poly SiC or other | SiO$_2$ or Si$_3$N$_4$ |
| + etching a portion of the GaN or other | Mono SiC or {111} Si or sapphire + etching | Poly (or mono) SiC or poly AlN or diamond or other | AlN or GaN or poly SiC or other | SiO$_2$ or Si$_3$N$_4$ |

Example 10

In this example (see first row of Table 3) a structure is made that includes a thin layer 2 of monocrystalline silicon carbide on an intermediate support 12 of polycrystalline silicon carbide with bonding layers 10 and 11 of silicon oxide between them. This structure can be made in the manner described above for the first and second implementations. Thereafter, a useful layer 16 of monocrystalline gallium nitride is formed on the free surface of the thin transfer layer 2 of silicon carbide by MOCVD. A thick support material 4 of polycrystalline silicon carbide is then deposited by CVD on the useful layer 16. The resulting structure is then subjected to a step 700 of treatment suitable for separating the structure made of the thin transfer layer 2, the useful layer 16, and the thick support layer 4 from the intermediate support 12. For example, the treatment may consist of etching with hydrofluoric acid, with or without mechanical stress being applied, or merely by removing matter. This provides a structure or stack that includes a thick support layer 4 that supports a useful layer 16 of gallium nitride, itself covered by a thin transfer layer 2 of monocrystalline silicon carbide. After separation, the intermediate support 12 is ready for recycling.

In this case, and unlike the second implementation of the method described above, the monocrystalline gallium nitride is deposited before the thick support layer 4 is formed.

Example 11

In another example of the third implementation, the structure of Example 10 is made and then the thin transfer layer 2 of monocrystalline silicon carbide is withdrawn, for example, by using a step 800 of etching with plasma (see second row of Table 3).

Example 12

In yet another example of this third implementation (see third row of Table 3), a structure of the kind described in Example 11 is made, except that not only is the transfer layer 2 of monocrystalline silicon carbide removed, but a portion of the useful layer of gallium nitride is also removed.

It should be noted that the thin transfer layer 2 of monocrystalline silicon carbide, or the useful layer 16 of monocrystalline gallium nitride can be subjected to various additional processing steps prior to the deposit of the support material 4. These steps may produce electronic components, in full or in part, or they can comprise making uniform deposits of additional films by epitaxial growth or otherwise.

It should also be noted that the polarity of the thin transfer layer 2 of monocrystalline silicon carbide and that of the useful layer 16 of gallium nitride can be determined by selecting the polarity of the initial source substrate 6. Optionally, the method can include at least one double transfer to enable the polarity to be changed twice in succession.

Similarly, these examples can be changed, for example, to form a useful layer 16 of aluminum nitride, or an alloy of aluminum and gallium, or of an alloy of gallium and indium, instead of the gallium nitride useful layer 16 as described above. The gallium nitride useful layer 16 can also be made by forming a multilayer structure that includes a stack of layers including gallium nitride, aluminum nitride, and other types of layers, possibly with doping of different kinds.

In other variants, the nature of the intermediate support 12 is changed. Thus, monocrystalline silicon carbide is used (in particular when the intermediate support is recycled), or else use is made of diamond or some other material to replace the polycrystalline silicon carbide or the aluminum nitride.

Figure 5:
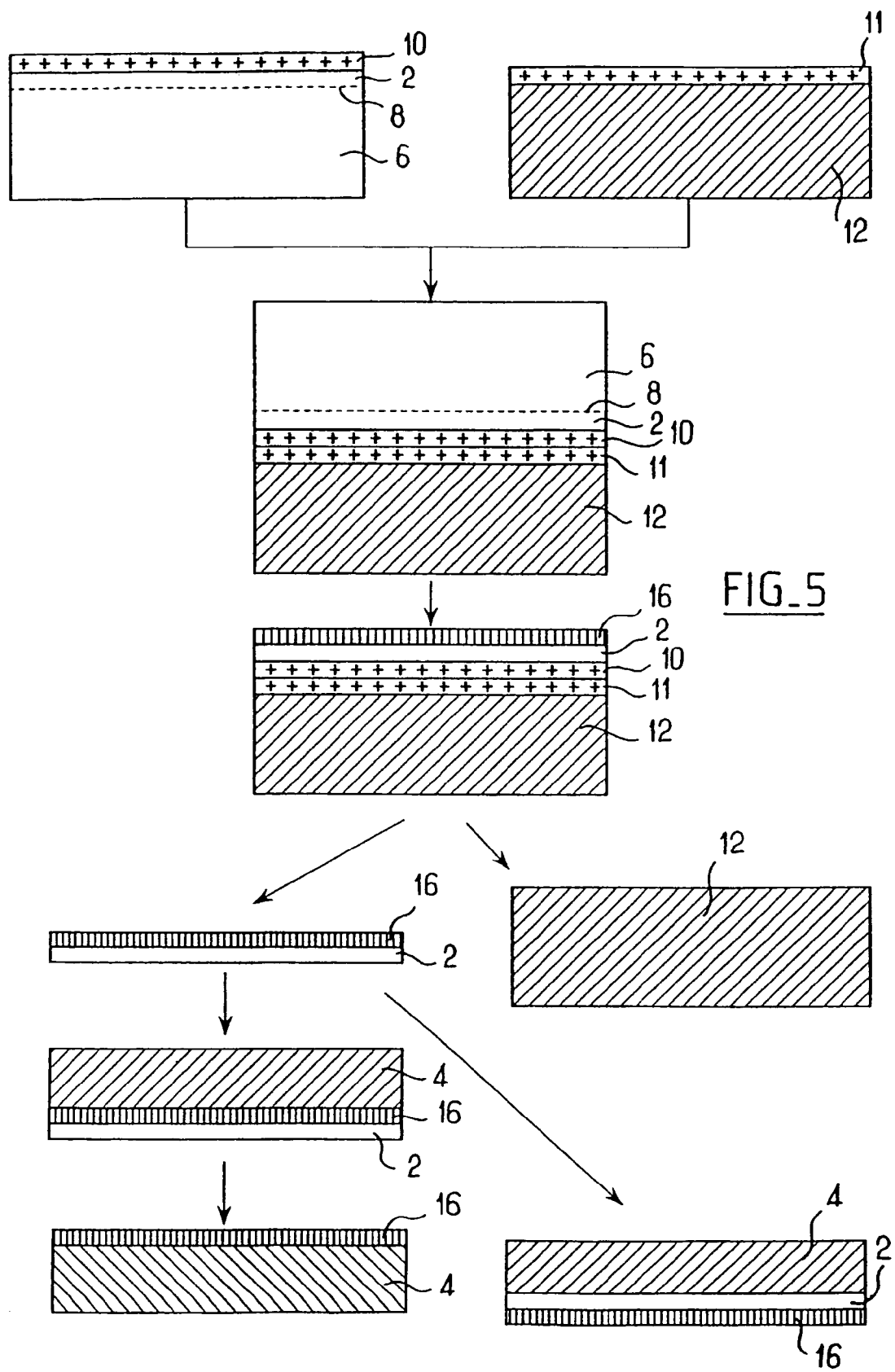
FIG. 5 is a diagram of the steps in yet another implementation of the method in accordance with the invention.

In a fourth embodiment of the present method, as shown in FIG. 5, a useful layer 16 is deposited on a thin transfer layer 2 that is located on an intermediate support 12. The useful layer is deposited prior to separating the intermediate support 12 from the structure made of the thin transfer layer 2 and the useful layer 16. The thick support layer 4 is then deposited on the thin transfer layer 2, or on the useful layer 16. Thus, the support material is deposited on one side or the other of the structure that includes the thin transfer layer 2 and the useful layer 16.

This fourth implementation of the method is illustrated by the following two examples.

Example 13

In this example, the following steps are performed. The method includes forming a structure made up of a thin transfer layer 2 of monocrystalline silicon carbide on a source substrate 6 with a zone of weakness 8, and an intermediate support 12 with bonding layers 10 and 11 between them, which is as described above for the first implementation. Next, the technique includes detaching the thin layer 2 from the source substrate 6 via a zone of weakness 8 (which is obtained by an implanting step performed in the source substrate 6 prior to being put into contact with the intermediate support 12). A useful layer 16 of monocrystalline gallium nitride is then deposited on the free surface of the thin layer 2 of silicon carbide. The composite substrate made of the thin layer 2 and the useful layer 16 is then detached from the intermediate support 12 (for example, by treatment in a bath of hydrofluoric acid). Lastly, a thick support material layer 4 of polycrystalline silicon carbide is deposited on the free surface of the useful layer 16.

Example 14

In this example, the procedure is the same as in the preceding example, except that the step of depositing the thick support layer 4 on the useful layer 16 is replaced by a step of depositing the thick layer 4 on the thin transfer layer 2.

As mentioned above, if the thickness and the strength of the thin layer 2 together with the useful layer 16 are sufficient, then the implementations described above can be realized without using an intermediate support 12. It may also be possible to realize the implementations without using an intermediate support 12 while depositing the thick support layer 4, but then a temporary support could be used which serves as a stiffener. Such a temporary support could be removed before depositing the thick layer 4.

Figure 6:
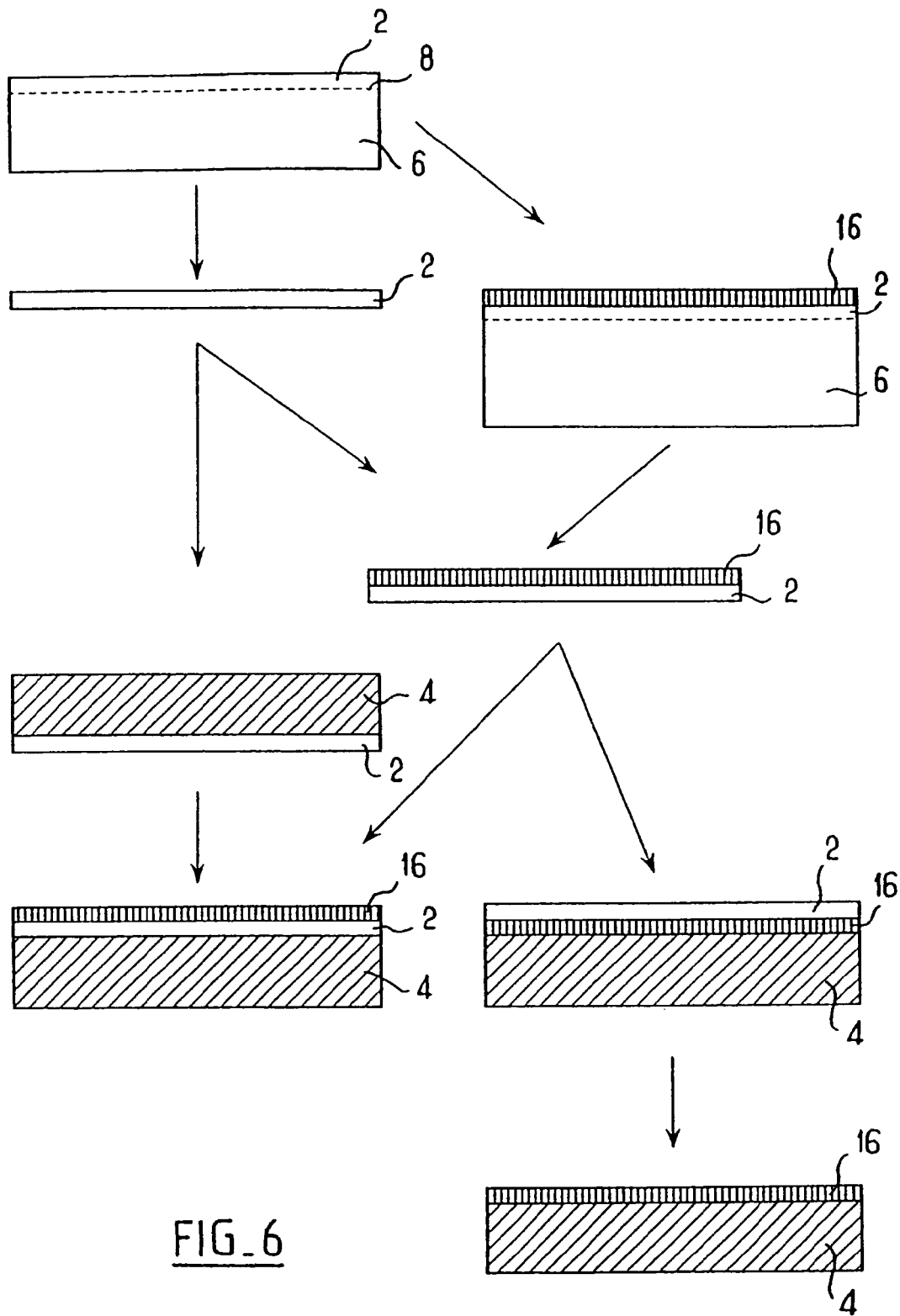
FIG. 6 is a diagram of the steps in yet another implementation of the method in accordance with the invention.

The fifth implementation corresponds to methods that do not use either an intermediate support 12 or a temporary support. Several examples of such implementations that do not include an intermediate support 12 are shown in FIG. 6. In particular, starting from a source substrate 6 in which a zone of weakness 8 has been produced (for example, by implanting atomic species), it is possible to separate the thin transfer layer 2 by itself. It is also possible to deposit a useful layer 16 on the thin layer prior to separating it from the source substrate 6 via the zone of weakness 8. In the first case, the thick support layer 4 can be deposited on the thin transfer layer 2 (thus reproducing the final substrate 14 of Example 1, for example). This technique can also be continued by depositing a useful layer 16 on the opposite face of the thin layer 2 (opposite of the face that received the thick support layer 4) to form the final substrate 14 of Example 4, for example. In the second case, the thick support layer 4 is deposited on the same side as the thin transfer layer 2 (thus reproducing the final substrate 14 of Example 4) or on the same side as the useful layer 16 (thus reproducing the final substrate 14 of Example 10). Optionally, as described with reference to FIG. 4 (see step 800), it is then possible to remove the thin transfer layer 2 (thus reproducing the final substrate of Example 11, for example).

Numerous variants of the implementations described above are contemplated. For example, the various operations described above in the examples can be combined.

Figure 7:
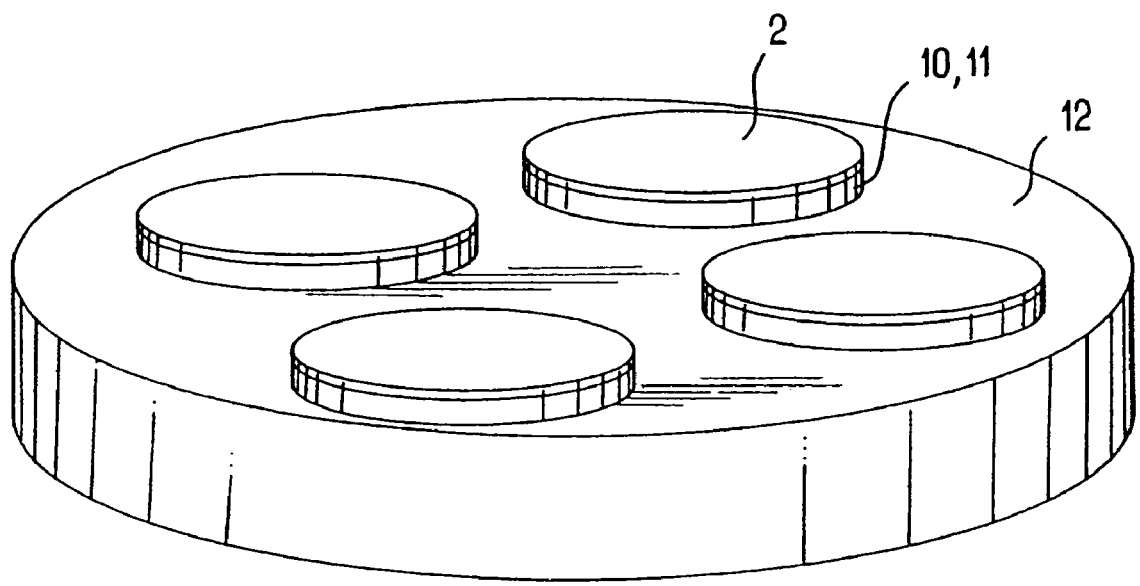
FIG. 7 is a diagrammatic perspective view of an intermediate support having four thin layers that can be used in a variant of the method of the invention.

As shown in FIG. 7, one variant of the method includes batch processing thin transfer layers 2 that have been obtained prior to depositing the thick support material layer 4. Under such circumstances, the thin transfer layers 2 are fixed on a single intermediate support 12 of large size. It should be noted that the single intermediate support 12 can be an arbitrary shape (circular, rectangular, square, or other shape). The thin transfer layers 2 can be identical or they can be different. Each of the thin layers 2 can be subjected to a separate operation of detaching the thin transfer layer from the intermediate support 12. For example, the single intermediate support 12 can be a plate of polycrystalline silicon carbide covered in a silicon oxide. After the thick support material layer 4 has been deposited, the composite substrate comprising the single intermediate support 12 and the associated thin layers 2 and thick support layers 4 can be subjected to a lift-off operation in a bath of hydrofluoric acid. Each individual intermediate support 12 can then be recycled.

In yet another variant of the implementations described above, a thick support layer 4 is deposited on a surface that is larger than the surface corresponding to the main faces of the thin transfer layer 2. This variant is shown in FIG. 8, wherein a structure is made of a thin transfer layer 2 on an intermediate support 12 with bonding layers 10 and 11 between them (similar to that made in the first implementation described above). This structure is then placed in a sample carrier 20 in such a manner that the free surface of the thin transfer layer 2 is flush with the surface of the sample carrier 20 (see FIG. 8*a*). A thick support layer 4 is then formed on the free surface and overflows onto the sample carrier 20.

The substrate formed in this way can optionally be subjected to treatment suitable for eliminating the projecting edges of the thin transfer layer 2. The edges of a deposited layer generally present irregularities, such as defects, beading, and the like. The present variant makes it possible to eliminate such edges. This variant is also advantageous for forming a substrate having a diameter that is greater than that of the thin layer 2, and adapted to a line for processing substrates of a given diameter, even though the thin layer 2 cannot be formed to have that diameter. This variant is also advantageous when, during formation of a single thick support layer 4 on a plurality of thin layers 2, a single support is made for a plurality of thin transfer layers 2 and/or useful layers 16 (see FIG. 8*b*). This variant can also be implemented by forming a thick support material layer 4 on each of the assemblies made of an intermediate support 12 and a thin transfer layer 2 and placed on a plane sample carrier. The thick support layer 4 then drops back onto the edges of the thin transfer layer 2.

A variant of the method optimizes the parameters for depositing the thick support layer 4 so that the thick layer 4 is formed as a single crystal. Even if the quality of such a monocrystalline thick support layer 4 is not good, it can be suitable for numerous applications that require very high crystal quality only on the surface of the transfer layer 2 or useful layer 16. Such variants of the method are particularly advantageous when it is not possible to grow single crystals (as is the case for gallium nitride) or when it is expensive to grow single crystals (as is the case for monocrystalline silicon carbide).

It is possible to perform chemical vapor deposition of a thick support layer 4 of silicon carbide on a surface of layer 2 or 16 which then acts as a seed layer for growing the thick support layer 4, while using very high rates of growth (several tens to several hundreds of microns per hour).

It will be observed that conventional techniques often grow thin transfer layers 2 on a support by epitaxy. Under such circumstances, the substrate must be of very good quality so as to ensure that the epitaxially grown thin layer is likewise of very good quality, to ensure that defects are not transferred.

In contrast, the present method enables the thick support layer 4 to be made at low cost since it is a support whose quality can often be inferior, particularly since it is not necessarily used for restarting epitaxial growth.

In other variants, the above described methods may be used with other types of semiconductors such as indium phosphide and gallium arsenide, or used with other materials such as lithium niobate.

In yet other variants, an intermediate layer, such as an insulating layer, can be made between the thin transfer layer 2 and/or the useful layer 16, and on the thick support layer 4, or between the thin layer 2 and the useful layer 16. For example, an intermediate layer can be made of diamond or of fine oxide (of about 500 Å thick).

What is claimed is:

1. A method of fabricating a final substrate for use in optics, electronics, or optoelectronics which comprises: forming a zone of weakness beneath a surface of a source substrate to define a transfer layer; detaching the transfer layer from the source substrate along the zone of weakness; depositing a useful layer upon the transfer layer; obtaining a bilayer consisting of the useful layer and the transfer layer; and progressively depositing a support material on one of the useful layer or the transfer layer to form the final substrate.

2. The method of claim 1, wherein the zone of weakness is formed by implanting atomic species into the source substrate.

3. The method of claim 1, wherein the transfer layer is a relatively thin layer of a monocrystalline material as compared to the relatively thick layer of support material.

4. The method of claim 1, wherein the support material is deposited using at least one of chemical vapor deposition, liquid deposition, or molecular beam deposition.

5. The method of claim 1, wherein the useful layer is made of a material having a wide band gap.

6. The method of claim 1, wherein the useful layer is made of compounds of at least two elements including at least one element of aluminum, indium, and gallium.

7. The method of claim 1, wherein the support material is made of at least one of monocrystalline materials, polycrystalline materials, amorphous materials, materials comprising a plurality of phases, and materials that are less expensive than that of the transfer layer.

8. The method of claim 1, wherein the transfer layer is made of at least one of silicon (1,1,1,), silicon carbide, a monocrystalline material, sapphire, diamond, gallium nitride, aluminum nitride, or a combination of at least two of these materials.

9. The method of claim 1, wherein the support material is made of at least one of silicon, silicon carbide, sapphire, diamond, graphite, gallium nitride, aluminum nitride, and a combination of at least two of these materials.

10. The method of claim 1, which further comprises optimizing the conditions under which the support material is deposited so that the support material exhibits at least one of monocrystalline quality, polycrystalline quality, an insulating quality, and a conductive quality.

11. The method of claim 1, which further comprises transferring the transfer layer to an intermediate support, depositing the useful layer on the transfer layer and then removing the intermediate support to form the final substrate.

12. The method of claim 1, wherein the source substrate is removed after depositing the useful layer.

13. The method of claim 1, wherein the support material is of a lower crystalline quality than the useful or transfer layers.

14. The method of claim 1, wherein the support material is deposited by vapor phase epitaxy, hydride vapor phase epitaxy, or by high temperature chemical vapor deposition.

15. The method of claim 1, wherein the useful layer is made of a material comprising at least one of gallium nitride, or aluminum nitride.

16. A method of fabricating a final substrate for use in optics, electronics, or optoelectronics which comprises: forming a zone of weakness beneath a surface of a source substrate to define a transfer layer; detaching the transfer layer from the source substrate along the zone of weakness; depositing a useful layer upon the transfer layer; obtaining a bilayer consisting of the useful layer and the transfer layer; and depositing a support material on one of the useful layer or the transfer layer to form the final substrate; and transferring the transfer layer to an intermediate support prior to obtaining the bilayer by depositing the useful layer thereon.

17. The method of claim 16, wherein the intermediate support includes a plurality of transfer layers.

18. The method of claim 16, which further comprises forming a bonding layer on one of the transfer layer or the useful layer, or both, to facilitate bonding of the useful and transfer layers.

19. The method of claim 18, wherein the bonding layer is made of at least one of amorphous materials, polycrystalline materials, and metallic materials.

20. The method of claim 16, wherein the support material is deposited using at least one of chemical vapor deposition, liquid deposition, or molecular beam deposition.

21. The method of claim 16, wherein the support material is deposited by vapor phase epitaxy, hydride vapor phase epitaxy, or by high temperature chemical vapor deposition.

* * * * *

UNITED STATES PATENT AND TRADEMARK OFFICE
CERTIFICATE OF CORRECTION

PATENT NO. : 7,422,957 B2 Page 1 of 1
APPLICATION NO. : 11/402052
DATED : September 9, 2008
INVENTOR(S) : Ghyselen et al.

It is certified that error appears in the above-identified patent and that said Letters Patent is hereby corrected as shown below:

Column 8:
Line 8, before "the thin transfer layer 2" change "of" to -- from --.

Signed and Sealed this

Twenty-eighth Day of October, 2008

JON W. DUDAS
*Director of the United States Patent and Trademark Office*